United States Patent
Wada et al.

(10) Patent No.: US 11,824,137 B2
(45) Date of Patent: Nov. 21, 2023

(54) SEMICONDUCTOR LIGHT-EMITTING ELEMENT AND METHOD FOR MANUFACTURING SEMICONDUCTOR LIGHT-EMITTING ELEMENT

(71) Applicant: NIKKISO CO., LTD., Tokyo (JP)

(72) Inventors: Mitsugu Wada, Hakusan (JP); Shinya Fukahori, Hakusan (JP)

(73) Assignee: NIKKISO CO., LTD., Tokyo (JP)

( * ) Notice: Subject to any disclaimer, the term of this patent is extended or adjusted under 35 U.S.C. 154(b) by 0 days.

(21) Appl. No.: 16/563,337

(22) Filed: Sep. 6, 2019

(65) Prior Publication Data

US 2019/0393378 A1    Dec. 26, 2019

Related U.S. Application Data

(63) Continuation of application No. PCT/JP2018/006231, filed on Feb. 21, 2018.

(30) Foreign Application Priority Data

Mar. 8, 2017  (JP) .................. 2017-044055

(51) Int. Cl.
*H01L 33/06* (2010.01)
*H01L 33/00* (2010.01)
(Continued)

(52) U.S. Cl.
CPC .......... *H01L 33/06* (2013.01); *H01L 33/0025* (2013.01); *H01L 33/0075* (2013.01);
(Continued)

(58) Field of Classification Search
CPC ....................................................... H01L 33/06
(Continued)

(56) References Cited

U.S. PATENT DOCUMENTS 10,644,194 B2 * 5/2020 Kim ..................... H01L 33/32
2004/0026705 A1 2/2004 Kato et al.
(Continued)

FOREIGN PATENT DOCUMENTS

CN  1316123 A  10/2001
CN  101981711 A  2/2011
(Continued)

OTHER PUBLICATIONS

International Search Report With English Language Translation Based on Corresponding Application No. PCT/JP2018/006231, dated Apr. 3, 2018.
(Continued)

*Primary Examiner* — Hsin Yi Hsieh
(74) *Attorney, Agent, or Firm* — Muncy, Geissler, Olds & Lowe, P.C.

(57) ABSTRACT

A semiconductor light-emitting element includes: an n-type clad layer of an n-type AlGaN-based semiconductor material; an active layer including a planarizing layer of an AlGaN-based semiconductor material provided on the n-type clad layer, a barrier layer of an AlGaN-based semiconductor material provided on the planarizing layer, and a well layer of an AlGaN-based semiconductor material provided on the barrier layer; and a p-type semiconductor layer provided on the active layer. The active layer emits deep ultraviolet light having a wavelength of 360 nm or shorter, and a ground level of a conduction band of the planarizing layer is lower than a ground level of a conduction band of the barrier layer and higher than a ground level of a conduction band of the well layer.

8 Claims, 2 Drawing Sheets

(51) Int. Cl.
  *H01L 33/14* (2010.01)
  *H01L 33/24* (2010.01)
  *H01L 33/32* (2010.01)
  *H01L 33/12* (2010.01)
(52) U.S. Cl.
  CPC .............. *H01L 33/14* (2013.01); *H01L 33/24* (2013.01); *H01L 33/32* (2013.01); *H01L 33/12* (2013.01)
(58) Field of Classification Search
  USPC .......................................................... 257/13
  See application file for complete search history.

(56) References Cited

U.S. PATENT DOCUMENTS

| | | | |
|---|---|---|---|
| 2009/0278113 A1 | 11/2009 | Chung et al. | |
| 2013/0187125 A1* | 7/2013 | Yeh ....................... | H01L 33/007 257/13 |
| 2014/0054542 A1* | 2/2014 | Han ....................... | H01L 33/32 257/13 |
| 2015/0372189 A1* | 12/2015 | Matsuura .............. | H01S 5/3407 257/13 |
| 2018/0013033 A1* | 1/2018 | Zhu ........................ | H01L 33/14 |
| 2018/0287014 A1* | 10/2018 | Asada ................... | H01L 33/145 |

FOREIGN PATENT DOCUMENTS

| | | |
|---|---|---|
| CN | 101997268 A | 3/2011 |
| CN | 102169931 A | 8/2011 |
| CN | 103633208 A | 3/2014 |
| EP | 2270879 A1 | 1/2011 |
| EP | 2701210 A2 | 2/2014 |
| JP | 2000156544 A | 6/2000 |
| JP | 2002100837 A | 4/2002 |
| JP | 2008140917 A | 6/2008 |
| JP | 2008251643 A | 10/2008 |
| JP | 2009260203 A | 11/2009 |
| JP | 2013165261 A | 8/2013 |
| JP | 2014241397 A | 12/2014 |
| JP | 2015053531 A | 3/2015 |
| WO | WO-2005101532 A1 | 10/2005 |

OTHER PUBLICATIONS

Written Opinion of the International Searching Authority With English Language Translation Based on Corresponding Application No. PCT/JP2018/006231, dated Apr. 3, 2018.
Written Opinion of the IPEA Based on Corresponding Application No. PCT/JP2018/006231, dated Mar. 19, 2019.
International Preliminary Report on Patentability With English Language Translation Based on Corresponding Application No. PCT/JP2018/006231, dated Apr. 3, 2018.
Japanese Office Action; Notification of Reason(s) for Refusal Based on Corresponding Patent Application No. 2017-044055; dated Mar. 27, 2018.
Japanese Office Action; Notification of Reason(s) for Refusal Based on Corresponding Patent Application No. 2017-044055; dated Sep. 4, 2018.
European Search Report dated Oct. 14, 2020 in EP Application No. 18764536.1 (8 pages).
Office Action dated Oct. 6, 2020 in JP Application No. 2018-206563 (4 pages).
Office Action dated Dec. 8, 2021 in CN Application No. 201880015866.6, 18pages, w/translation.
An Office Action in corresponding CN Application No. 201880015866.6 dated Jun. 29, 2022 with English translation is attached, 15 pages.
Office Action dated Sep. 26, 2022 in CN Application No. 201880015866.6, 16 pages (w/English-language translation).
Chinese Office Action corresponding Patent Application No. 201880015866.6. dated Apr. 24, 2023 and its English translation; pp. 1-20.
Office Action issued for corresponding Chinese Patent Application No. 201880015866.6, dated Aug. 2, 2023.
Office Action issued for corresponding European Patent Application No. 18764536.1 and the cited documents, dated Sep. 15, 2023.

* cited by examiner

SEMICONDUCTOR LIGHT-EMITTING ELEMENT AND METHOD FOR MANUFACTURING SEMICONDUCTOR LIGHT-EMITTING ELEMENT

RELATED APPLICATION

The Priority is claimed to Japanese Patent Application No. 2017-044055, filed on Mar. 8, 2017, the entire content of which is incorporated herein by reference.

BACKGROUND OF THE INVENTION

1. Field of the Invention

The present invention relates to a semiconductor light-emitting element and a method for manufacturing a semiconductor light-emitting element.

2. Description of the Related Art

Recently, efforts have been made to develop semiconductor light-emitting elements for emitting deep ultraviolet light. A light-emitting element for emitting deep ultraviolet light includes an aluminum gallium nitride (AlGaN) based n-type clad layer, active layer, and p-type clad layer stacked successively on a substrate. It is proposed to insert a planarizing layer of a photonic crystal structure between the n-type clad layer and the active layer of gallium nitride (GaN) based light-emitting elements having a light emission wavelength of about 400 nm in order to enhance the flatness of the active layer.

To output deep ultraviolet light having a wavelength of 360 nm or shorter, it is necessary to use AlGaN having a high AlN composition ratio as the n-type clad layer. Insertion of a photonic crystal structure between the n-type clad layer with a high AlN composition ratio and the active layer affects the efficiency of injecting electrons into the active layer seriously and results in poorer light emission characteristics.

SUMMARY OF THE INVENTION

In this background, one illustrative purpose of the present invention is to provide a technology of improving the light emission characteristics of semiconductor light-emitting elements.

A semiconductor light-emitting element according to an embodiment of the present invention includes: an n-type clad layer of an n-type AlGaN-based semiconductor material; an active layer including a planarizing layer of an AlGaN-based semiconductor material provided on the n-type clad layer, a barrier layer of an AlGaN-based semiconductor material provided on the planarizing layer, and a well layer of an AlGaN-based semiconductor material provided on the barrier layer; and a p-type semiconductor layer provided on the active layer. The active layer emits deep ultraviolet light having a wavelength of 360 nm or shorter, and an AlN molar fraction of the planarizing layer is lower than that of the barrier layer, and a ground level of a conduction band of the planarizing layer is higher than that of the well layer.

According to the embodiment, the flatness of the well layer formed by an AlGaN-based semiconductor material having a low AlN composition ratio is increased by providing the barrier layer and the well layer on the planarizing layer having a relatively low AlN composition ratio. By configuring the ground level of the conduction band of the planarizing layer to be higher than that of the well layer, light emission in the planarizing layer is inhibited and light emission in the highly flat well layer is induced. This improves the light emission characteristics of the active layer and, in particular, reduces the full width at half maximum of the emission spectrum.

A thickness of the planarizing layer in a direction of stack may be smaller than that of the well layer.

An AlN molar fraction of the planarizing layer may be higher than that of the well layer.

A difference in ground level of a conduction band between the planarizing layer and the well layer may be equal to or larger than 2% of a light energy corresponding to a wavelength of light emitted from the active layer.

The planarizing layer may be a first planarizing layer, and the barrier layer may be a first barrier layer, the active layer may further include a second planarizing layer of an AlGaN-based semiconductor material provided between the first planarizing layer and the first barrier layer and a second barrier layer of an AlGaN-based semiconductor material provided between the first planarizing layer and the second planarizing layer. An AlN molar fraction of the second planarizing layer may be lower than that of the first barrier layer and the second barrier layer, and a ground level of a conduction band of the second planarizing layer may be higher than that of the active layer.

A thickness of the second planarizing layer in the direction of stack may be smaller than a thickness of the well layer.

An AlN molar fraction of the second planarizing layer may be higher than an AlN molar fraction of the well layer.

The active layer may further include a further barrier layer of an AlGaN-based semiconductor material provided between the n-type clad layer and the planarizing layer.

Another embodiment of the present invention relates to a method for manufacturing a semiconductor light-emitting element adapted to emit deep ultraviolet light having a wavelength of 360 nm or shorter. The method includes: forming a planarizing layer of an AlGaN-based semiconductor material on an n-type clad layer of an n-type AlGaN-based semiconductor material; forming a barrier layer of an AlGaN-based semiconductor material on the planarizing layer; forming a well layer of an AlGaN-based semiconductor material on the barrier layer; and forming a p-type semiconductor layer on the well layer. An AlN molar fraction of the planarizing layer is lower than that of the barrier layer, and a ground level of a conduction band of the planarizing layer is higher than that of the well layer.

According to the embodiment, the flatness of the well layer formed by an AlGaN-based semiconductor material having a low AlN composition ratio is increased by providing the barrier layer and the well layer on the planarizing layer having a relatively low AlN composition ratio. By configuring the ground level of the conduction band of the planarizing layer to be higher than that of the well layer, light emission in the planarizing layer is inhibited and light emission in the highly flat well layer is induced. This improves the light emission characteristics of the active layer and, in particular, reduces the full width at half maximum of the emission spectrum.

The forming of the barrier layer includes: supplying a Group-III material and a Group-V material to grow an AlGaN-based semiconductor material layer; and supplying a Group-V material for a duration not shorter than 6 seconds and not longer than 30 seconds while a supply of the Group-III material is being stopped so as to stabilize the AlGaN-based semiconductor material layer.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
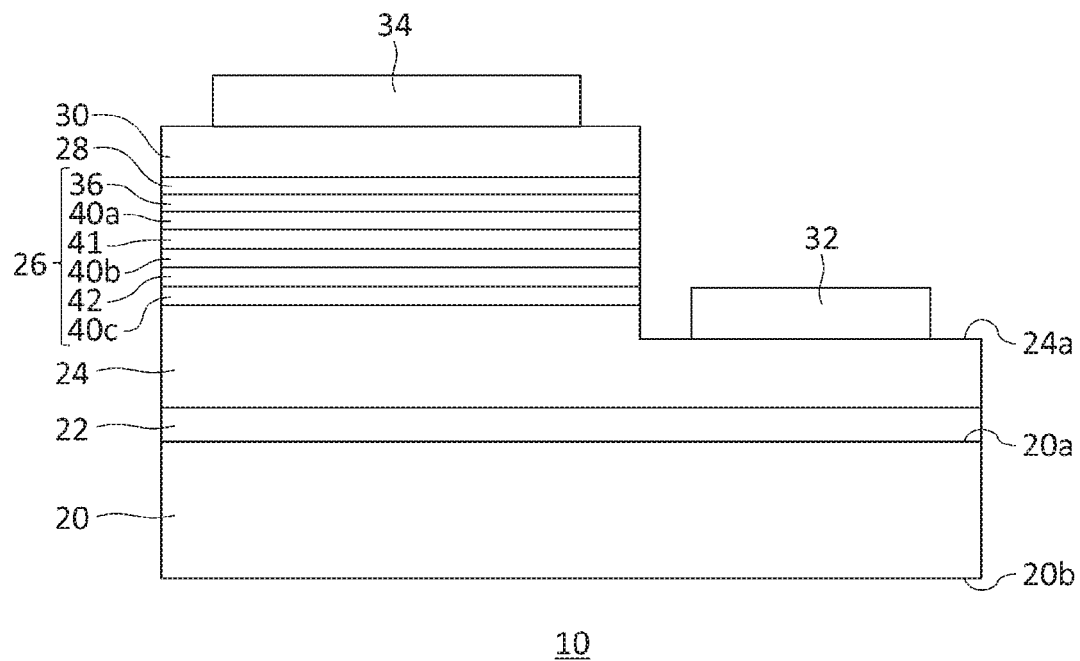
FIG. 1 is a cross-sectional view schematically showing a configuration of a semiconductor light-emitting element according to the embodiment.

The invention will now be described by reference to the preferred embodiments. This does not intend to limit the scope of the present invention, but to exemplify the invention.

A brief summary will be given before describing the invention in specific details. The embodiment relates to an aluminum gallium nitride (AlGaN) based semiconductor light-emitting element for outputting deep ultraviolet light having a wavelength of 360 nm or shorter. The light-emitting element is provided with an n-type clad layer on a substrate, an active layer on the n-type clad layer, and a p-type semiconductor layer on the active layer. The active layer includes a barrier layer made of an AlGaN-based semiconductor material and a well layer made of an AlGaN-based semiconductor material.

In the light-emitting element having the above structure, an aluminum nitride (AlN) layer is formed on a sapphire ($Al_2O_3$) substrate, and an n-type clad layer, an active layer, and a p-type semiconductor layer are formed on the AlN layer. As a result, more serious lattice mismatch is arisen between the n-type clad layer or the active layer and the substrate than in the case of using a gallium nitride (GaN) substrate. It also easily results in a rough crystal surface on an atomic level and a poorer flatness of the crystal surface. In the case of forming an active layer, and, in particular, a well layer, on a surface having a poor flatness, it is difficult to form a well layer of an even thickness. The emission wavelength of the active layer is affected by the thickness of the well layer in the quantum well structure. Therefore, uneven thickness of the well layer results in variation in the emission wavelength and spread light emission spectral width. This will result in poorer monochromaticity of the output light.

The embodiment addresses the issue by inserting a planarizing layer between the n-type clad layer and the well layer to increase the flatness of the crystal surface of the well layer and improve the evenness of the thickness of the well layer. In particular, the difference in grating constant between the substrate and the well layer is moderated to form a highly flat well layer by approximating the AlN composition ratio of the planarizing layer to that of the well layer. In further accordance with the embodiment, light emission in the planarizing layer is inhibited and degradation in the light emission characteristics caused by light emission in the planarizing layer is prevented by configuring the ground level of the conduction band of the planarizing layer to be higher than that of the well layer.

A detailed description will be given of an embodiment to practice the present invention with reference to the drawings. Like numerals are used in the description to denote like elements and a duplicate description is omitted as appropriate. To facilitate the understanding, the relative dimensions of the constituting elements in the drawings do not necessarily mirror the relative dimensions in the actual light-emitting element.

FIG. 1 is a cross-sectional view schematically showing a configuration of a semiconductor light-emitting element 10 according to the embodiment. The semiconductor light-emitting element 10 is a light emitting diode (LED) chip configured to emit "deep ultraviolet light" having a central wavelength A of about 360 nm or shorter. To output deep ultraviolet light having such a wavelength, the semiconductor light-emitting element 10 is made of an aluminum gallium nitride (AlGaN) based semiconductor material having a band gap of about 3.4 eV or larger. The embodiment particularly shows a case of emitting deep ultraviolet light having a central wavelength A of about 240 nm-350 nm.

In this specification, the term "AlGaN-based semiconductor material" refers to a semiconductor material mainly containing aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0 \le x+y \le 1$, $0 \le x \le 1$, $0 \le y \le 1$). The AlGaN-based semiconductor material shall contain AlN, GaN, AlGaN, indium aluminum nitride (InAlN), indium gallium nitride (InGaN), or indium aluminum gallium nitride (InAlGaN).

Of "AlGaN-based semiconductor materials", those materials that do not substantially contain AlN may be distinguished by referring to them as "GaN-based semiconductor materials". "GaN-based semiconductor materials" mainly contain GaN or InGaN and encompass materials that additionally contain a slight amount of AlN. Similarly, of "AlGaN-based semiconductor materials", those materials that do not substantially contain GaN may be distinguished by referring to them as "AlN-based semiconductor materials". "AlN-based semiconductor materials" mainly contain AlN or InAlN and encompass materials that additionally contain a slight amount of GaN.

The semiconductor light-emitting element 10 includes a substrate 20, a buffer layer 22, an n-type clad layer 24, an active layer 26, an electron block layer 28, a p-type clad layer 30, an n-side electrode 32, and a p-side electrode 34.

The substrate 20 is a substrate having translucency for the deep ultraviolet light emitted by the semiconductor light-emitting element 10 and is, for example, a sapphire ($Al_2O_3$) substrate. The substrate 20 includes a first principal surface 20a and a second principal surface 20b opposite to the first principal surface 20a. The first principal surface 20a is a principal surface that is a crystal growth surface for growing the buffer layer 22 and the layers above. The second principal surface 20b is a principal surface that is a light extraction substrate for extracting the deep ultraviolet light emitted by the active layer 26 outside. In one variation, the substrate 20 may be an aluminum nitride (AlN) substrate or an aluminum gallium nitride (AlGaN) substrate.

The buffer layer 22 is formed on the first principal surface 20a of the substrate 20. The buffer layer 22 is a foundation layer (template layer) to form the n-type clad layer 24 and the layers above. For example, the buffer layer 22 is an undoped AlN layer and is, specifically, an AlN (HT-AlN; High Temperature AlN) layer gown at a high temperature.

The buffer layer 22 may include an undoped AlGaN layer formed on the AlN layer. In one variation, the buffer layer 22 may be formed only by an undoped AlGaN layer when the substrate 20 is an AlN substrate or an AlGaN substrate. In other words, the buffer layer 22 includes at least one of an undoped AlN layer and AlGaN layer.

The n-type clad layer 24 is formed on the buffer layer 22. The n-type clad layer 24 is an n-type AlGaN-based semiconductor material layer. For example, the n-type clad layer 24 is an AlGaN layer doped with silicon (Si) as an n-type impurity. The composition ratio of the n-type clad layer 24 is selected to transmit the deep ultraviolet light emitted by the active layer 26. For example, the n-type clad layer 24 is formed such that the molar fraction of AlN is 20% or higher, and, preferably, 40% or higher or 50% or higher. The n-type clad layer 24 has a band gap larger than the wavelength of the deep ultraviolet light emitted by the active layer 26. For example, the n-type clad layer 24 is formed to have a band gap of 4.3 eV or larger. It is preferable to form the n-type clad layer 24 such that the molar fraction of AlN is 80% or lower, i.e., the band gap is 5.5 eV or smaller. It is more preferable to form the n-type clad layer 24 such that the molar fraction of AlN is 70% or lower (i.e., the band gap is 5.2 eV or smaller). The n-type clad layer 24 has a thickness of about 1 µm-3 µm. For example, the n-type clad layer 24 has a thickness of about 2 µm.

The active layer 26 is made of an undoped AlGaN-based semiconductor material and forms a double heterojunction structure by being sandwiched by the n-type clad layer 24 and the electron block layer 28. The active layer 26 has a quantum well structure and includes a well layer 36 made of an AlGaN-based semiconductor material, barrier layers 40a, 40b, 40c (also generically referred to as a barrier layers 40) made of an AlGaN-based semiconductor material, and planarizing layers 41, 42 made of an AlGaN-based semiconductor material. In the illustrated example, the third barrier layer 40c, the second planarizing layer 42, the second barrier layer 40b, the first planarizing layer 41, the first barrier layer 40a, and the well layer 36 are stacked successively on the n-type clad layer 24. The detailed configuration of the active layer 26 will be described later with reference to FIG. 2.

The electron block layer 28 is formed on the active layer 26. The electron block layer 28 is a p-type AlGaN-based semiconductor material layer and is formed such that the molar fraction of AlN is 40% or higher, and, preferably, 50% or higher. The electron block layer 28 may be formed such that the molar fraction of AlN is 80% or higher or may be made of an AlN-based semiconductor material that does not substantially contain GaN. The electron block layer has a thickness of about 1 nm-10 nm. For example, the electron block layer has a thickness of about 2 nm-5 nm. The electron block layer 28 may not be a p-type layer and may be an undoped semiconductor layer.

The p-type clad layer 30 is a p-type semiconductor layer formed on the electron block layer 28. The p-type clad layer 30 is a p-type AlGaN-based semiconductor material layer. For example, the p-type clad layer 30 is an AlGaN layer doped with magnesium (Mg) as a p-type impurity. The p-type clad layer 30 has a thickness of about 300 nm-700 nm. For example, the p-type clad layer 30 has a thickness of about 400 nm-600 nm. The p-type clad layer 30 may be made of a p-type GaN-based semiconductor material that does not substantially contain AlN.

The n-side electrode 32 is formed in a partial region on the n-type clad layer 24. The n-side electrode 32 is formed by a multilayer film in which titanium (Ti)/aluminum (Al)/Ti/gold (Au) are layered on the n-type clad layer 24 successively. The p-side electrode 34 is formed on the p-type clad layer 30. The p-side electrode 34 is formed by a nickel (Ni)/gold (Au) multilayer film built on the p-type clad layer 30 successively.

Figure 2:
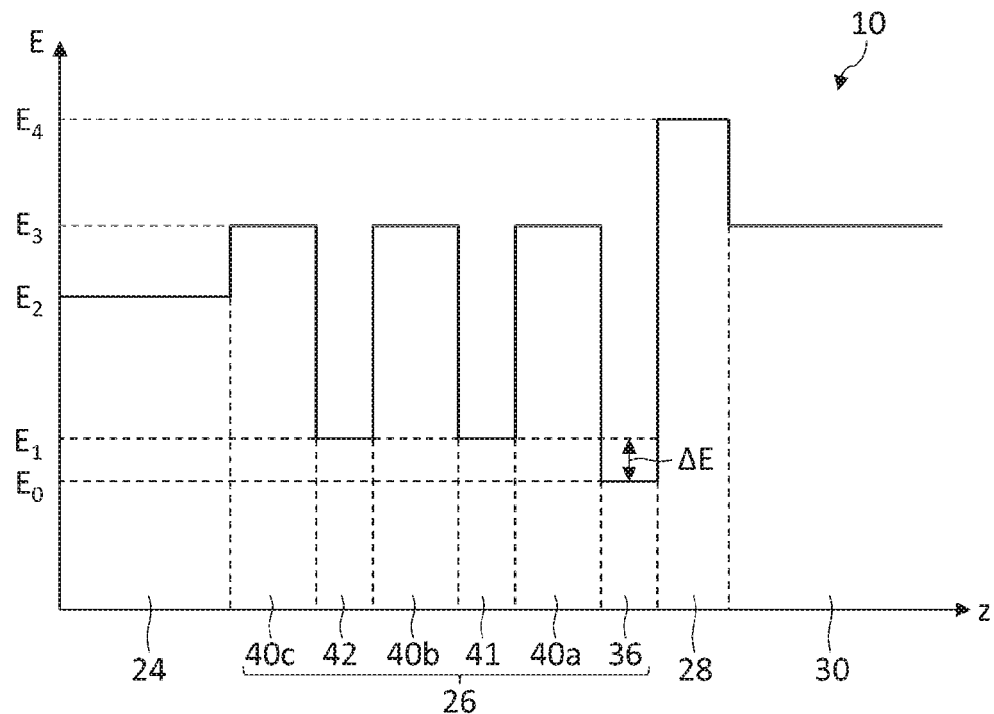
FIG. 2 schematically shows an energy band of the semiconductor light-emitting element.

FIG. 2 schematically shows an energy band of the semiconductor light-emitting element 10 and, in particular, schematically shows the ground level of the conduction band near the active layer 26. As illustrated, the ground level $E_0$ of the well layer 36 is the lowest, and the ground level $E_1$ of the planarizing layers 41, 42 is slightly higher than the ground level of the well layer 36 by $\Delta E$. The ground level E3 of the barrier layers 40 (40a, 40b, 40c) is higher than the ground level of the well layer 36 or the planarizing layers 41, 42 and higher than the ground level E2 of the n-type clad layer 24. The ground level E4 of the electron block layer 28 is higher than the ground level of the barrier layers 40.

The well layer 36 made of an undoped AlGaN-based semiconductor material. The well layer 36 is configured to have a band gap smaller than that of the barrier layers 40 and an AlN molar fraction smaller than that of the barrier layers 40. The well layer 36 is configured to form a quantum well structure along with the adjacent barrier layer 40 and to have a band gap of 3.4 eV or larger to output deep ultraviolet light having a wavelength of 360 nm or shorter. The AlN molar fraction of the well layer 36 depends on the wavelength of light emitted by the active layer 26 and is configured to be, for example, 10% or higher, and, preferably, 15% or higher. The AlN molar fraction of the well layer 36 is, specifically, about 15%, 20%, 25%, 30%, 35%, or 40%.

The barrier layers 40 (40a, 40b, 40c) are made of an undoped AlGaN-based semiconductor material. The barrier layers 40 are configured to have a band gap larger than that of the well layer 36 and the planarizing layers 41, 42 and to have an AlN molar fraction higher than that of these layers. The AlN molar fraction of the barrier layers 40 depends on the wavelength of light emitted by the active layer 26 and is configured to be 40% or higher, and, preferably, 50% or higher. The AlN molar fraction of the barrier layers 40 may be 60% or higher and may be, specifically, about 65%, 70%, 75%, 80%, or 85%.

The planarizing layers 41, 42 are made of an undoped AlGaN-based semiconductor material. The planarizing layers 41, 42 are configured to have a band gap smaller than that of the barrier layers 40 and to have an AlN molar fraction lower than that of the barrier layers 40. Therefore, the planarizing layers 41, 42 form a quantum well structure along with the adjacent barrier layers 40, respectively. Meanwhile, the planarizing layers 41, 42 are configured such that the ground level $E_1$ of the quantum well is higher than the ground level of the well layer 36 so as to prevent substantive light emission from being induced recombined carriers in the planarizing layers 41, 42.

To prevent substantive light emission in the planarizing layers 41, 42, it is necessary to configure the difference $\Delta E$ (=E1−E0) in ground level between the well layer 36 and the planarizing layers 41, 42 to be equal to or larger than 2%, and, preferably, 3%, of the light energy $E=hc/\lambda$ corresponding to the wavelength A of the light emitted from the well layer 36. Meanwhile, it is preferred that the AlN composition ratio of the well layer 36 is similar to that of the planarizing layers 41, 42 in order to improve the flatness of the well layer 36. It is preferred that the difference in AlN molar fraction between the well layer 36 and the planarizing layers 41, 42 is 10% or less (e.g., 5% or less).

The value of the ground level $E_1$ of the planarizing layers 41, 42 can be controlled by appropriately selecting the AlN molar fraction of the AlGaN-based semiconductor material and the thickness of the planarizing layers 41, 42 in the direction of stack. For example, by configuring the AlN molar fraction of the planarizing layers 41, 42 to be higher than that of the well layer 36, the band gap of the planarizing layers 41, 42 is increased, and the ground level $E_1$ of the planarizing layers 41, 42 is ensured to be larger than the ground level $E_0$ of the well layer 36. Further, by decreasing the thickness of the planarizing layers 41, 42, the height of the ground level $E_1$ of the planarizing layers 41, 42 formed in the quantum well structure is increased.

In the case that the planarizing layers 41, 42 and the well layer 36 are configured to have the same thickness, the ground level $E_1$ of the planarizing layers 41, 42 is configured to be higher than the ground level $E_0$ of the well layer 36 by configuring the AlN composition ratio of the planarizing layers 41, 42 to be larger than the AlN composition ratio of the well layer 36. For example, the difference $\Delta E$ in ground level between the well layer 36 and the planarizing layers 41, 42 is configured to be 2% or larger by configuring the difference in AlN molar fraction between the well layer 36 and the planarizing layers 41, 42 to be 3% or larger.

In the case that the AlN composition ratio of the planarizing layers 41, 42 is configured to be equal to that of the well layer 36, on the other hand, the ground level $E_1$ of the planarizing layers 41, 42 is configured to be larger than the ground level $E_0$ of the well layer 36 by configuring the thickness of the planarizing layers 41, 42 to be smaller than the thickness of the well layer 36. For example, the thickness of the well layer 36 may be about 1.5-3 nm, and the thickness of the planarizing layers 41, 42 may be about 0.5-1.5 nm. By providing a difference in thickness of about 20%-50% between the well layer 36 and the planarizing layers 41, 42 in the above numerical range, light emission in the planarizing layers 41, 42 is suitably prevented.

The ground level $E_1$ of the planarizing layers 41, 42 may be adjusted by configuring both the AlN molar fraction and the thickness of the planarizing layers 41, 42 to be different from those of the well layer 36. For example, the ground level $E_1$ of the planarizing layers 41, 42 may be configured to be higher than that of the well layer 36 by configuring the AlN molar fraction of the planarizing layers 41, 42 to be lower than that of the well layer 36 and configuring the thickness of the planarizing layers 41, 42 to be smaller than that of the well layer 36.

The first planarizing layer 41 and the second planarizing layer 42 may have the same ground level $E_1$ or different ground levels. For example, the ground level of the first planarizing layer 41 nearer the well layer 36 may be configured to be higher than that of the second planarizing layer 42 farther from the well layer 36. Conversely, the ground level of the first planarizing layer 41 may be configured to be lower than that of the second planarizing layer 42. In either case, the ground level of each of the first planarizing layer 41 and the second planarizing layer 42 is configured to be higher than the ground level $E_0$ of the well layer 36.

In the illustrated example, two planarizing layers 41, 42 are provided. Alternatively, one planarizing layer or three or more planarizing layers may be provided. In the case one planarizing layer is provided, the second barrier layer 40b, the first planarizing layer 41, the first barrier layer 40a, and the well layer 36 are stacked successively on the n-type clad layer 24. In the case three or more planarizing layers are provided, further planarizing layers and barrier layers are inserted between the n-type clad layer 24 and the third barrier layer 40c.

Figure 3:
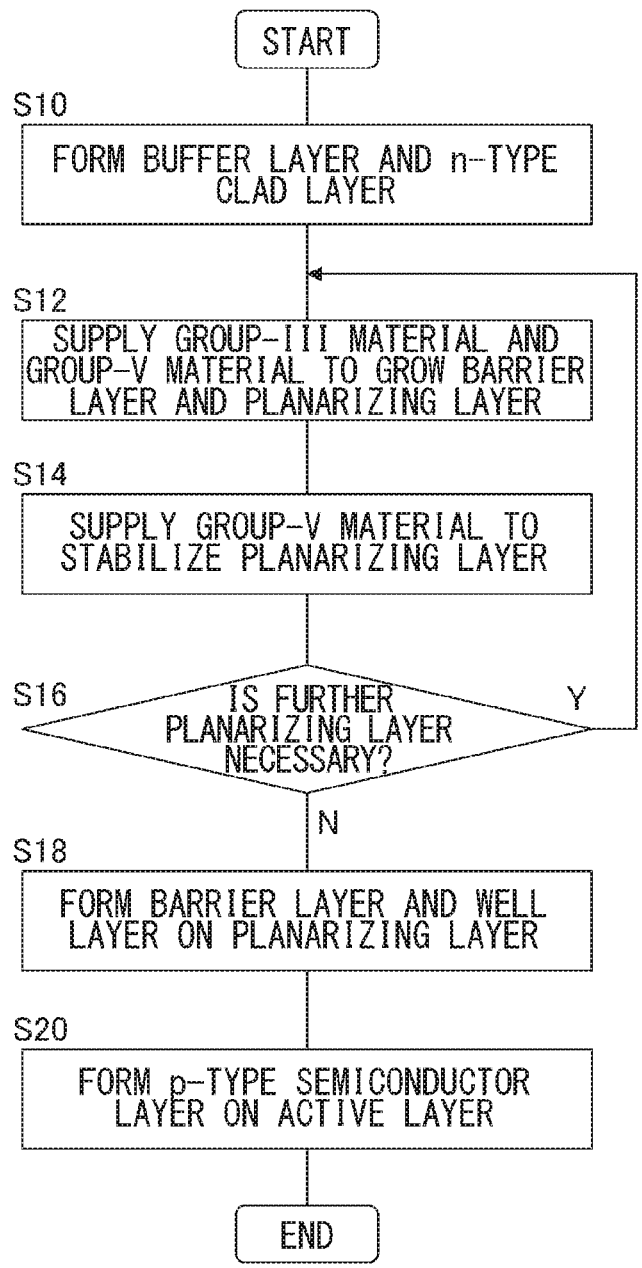
FIG. 3 is a flowchart showing a method for manufacturing the semiconductor light-emitting element.

A description will now be given of a method for manufacturing the semiconductor light-emitting element 10. FIG. 3 is a flowchart showing a method for manufacturing the semiconductor light-emitting element 10. First, the substrate 20 is prepared, and the buffer layer 22 and the n-type clad layer 24 are successively formed on the first principal surface 20a of the substrate 20 (S10).

The substrate 20 is a sapphire ($Al_2O_3$) substrate and is a growth substrate for forming an AlGaN-based semiconductor material. For example, the buffer layer 22 is formed on the (0001) plane of the sapphire substrate. The buffer layer 22 includes, for example, an AlN (HT-AlN) layer gown at a high temperature and an undoped AlGaN (u-AlGaN) layer. The n-type clad layer 24 is a layer made of an AlGaN-based semiconductor material and can be formed by using a well-known epitaxial growth method such as the metalorganic vapor phase epitaxy (MOVPE) method and the molecular beam epitaxy (MBE) method.

Subsequently, the barrier layer (third barrier layer 40c) is formed on the n-type clad layer 24, and the planarizing layer (second planarizing layer 42) is formed on the barrier layer (S12). The barrier layer and the planarizing layer are layers made of an AlGaN-based semiconductor material and can be formed by using a well-known epitaxial growth method such as the metalorganic vapor phase epitaxy (MOVPE) method and the molecular beam epitaxy (MBE) method. For example, the AlGaN-based semiconductor material layer can be grown by supplying, as a stock gas, trimethylaluminum (TMA; $(CH_3)_3Al$) and trimethylgallium (TMG; $CH_3)_3$ Ga), which are Group-III materials, and ammonia ($NH_3$), which is a Group-V material.

The planarizing layer is then stabilized by supplying a Group-V material while the supply of a Group-III material is being stopped (S14). The stabilizing step is performed for a duration not shorter than 6 seconds and not longer than 30 seconds. By supplying a Group-V material while the supply of a Group-III material is being stopped, the crystal quality of the surface of the planarizing layer is improved, and the even more planarized crystal surface is formed.

If a further planarizing layer is necessary (Y in S16), the steps of S12 and S14 are then repeated. For example, a further barrier layer (second barrier layer 40b) is formed on the second planarizing layer 42, and a further planarizing layer (first planarizing layer 41) is formed on the barrier layer, and the planarizing layer thus formed is stabilized. If a further planarizing layer is not necessary (N in S16), a barrier layer (first barrier layer 40a) is formed on the planarizing layer, and the well layer 36 is formed on the barrier layer. The well layer 36 is a layer made of an AlGaN-based semiconductor material and can be formed by using a well-known epitaxial growth method such as the metalorganic vapor phase epitaxy (MOVPE) method and the molecular beam epitaxy (MBE) method. This completes the active layer 26.

The p-type semiconductor layer is then formed on the active layer 26 (S20). For example, the electron block layer 28 is formed on the active layer 26, and the p-type clad layer 30 is then formed. The electron block layer 28 and the p-type clad layer 30 are layers made of an AlN-based semiconductor material or an AlGaN-based semiconductor material and can be formed by a well-known epitaxial growth method such as the metalorganic vapor phase epitaxy (MOVPE) method and the molecular beam epitaxy (MBE) method.

Subsequently, a mask is formed on the p-type clad layer 30, and the active layer 26, the electron block layer 28, and the p-type clad layer 30 in the exposed region, in which the mask is not formed, are removed. The active layer 26, electron block layer 28, and the p-type clad layer 30 may be removed by plasma etching. The n-side electrode 32 is formed on the exposed surface 24a of the n-type clad layer 24, and the p-side electrode 34 is formed on the p-type clad layer 30 with the mask removed. The n-side electrode 32 and the p-side electrode 34 may be formed by a well-known method such as electron beam deposition and sputtering. This completes the semiconductor light-emitting element 10 shown in FIG. 1.

A description will now be given of the advantage accomplished by the embodiment with reference to examples and comparative examples.

In example 1, the ground level $E_1$ of the conduction band of the planarizing layers 41, 42 is configured to be higher than the ground level $E_0$ of the well layer 36 by forming the two planarizing layers 41, 42 and configuring the AlN molar fraction of the planarizing layers 41, 42 to be higher than that of the well layer 36. In example 1, a stabilizing process is not performed when the planarizing layers 41, 42 are formed. In example 1, the wavelength of emitted light of 285 nm, the full width at half maximum of the emission spectrum of 17.8 nm, and the light output of 4.3 mW were obtained when an electric current of 100 mA is conducted.

In example 2, the ground level $E_1$ of the conduction band of the planarizing layers 41, 42 is configured to be higher than the ground level $E_0$ of the well layer 36 by forming the two planarizing layers 41, 42 and configuring the thickness of the planarizing layers 41, 42 to be smaller than that of the well layer 36. In example 2, a stabilizing process is not performed when the planarizing layers 41, 42 are formed. In example 2, the wavelength of emitted light of 285 nm, the full width at half maximum of the emission spectrum of 15.6 nm, and the light output of 4.4 mW were obtained when an electric current of 100 mA is conducted.

In example 3, as in example 2, the ground level $E_1$ of the conduction band of the planarizing layers 41, 42 is configured to be higher than the ground level $E_0$ of the well layer 36 by configuring the thickness of the two planarizing layers 41, 42 to be smaller than that of the well layer 36. In example 3, a stabilizing process is performed for a duration of 12 seconds when the planarizing layers 41, 42 are formed. In example 3, the wavelength of emitted light of 285 nm, the full width at half maximum of the emission spectrum of 13.6 nm, and the light output of 4.5 mW were obtained when an electric current of 100 mA is conducted.

In example 4, as in example 3, the ground level $E_1$ of the conduction band of the planarizing layers 41, 42 is configured to be higher than the ground level $E_0$ of the well layer 36 by configuring the thickness of the two planarizing layers 41, 42 to be smaller than that of the well layer 36. In example 4, a stabilizing process is performed for a duration of 24 seconds when the planarizing layers 41, 42 are formed. In example 4, the wavelength of emitted light of 285 nm, the full width at half maximum of the emission spectrum of 14.2 nm, and the light output of 4.3 mW were obtained when an electric current of 100 mA is conducted.

In comparative example 1, no planarizing layers are provided, and one barrier layer and one well layer are formed on the n-type clad layer 24. In comparative example 1, the wavelength of emitted light of 285 nm, the full width at half maximum of the emission spectrum of 20.2 nm, and the light output of 4.2 mW were obtained when an electric current of 100 mA is conducted.

In example 2, as in examples 2-4, the ground level $E_1$ of the conduction band of the planarizing layers 41, 42 is configured to be higher than the ground level $E_0$ of the well layer 36 by configuring the thickness of the two planarizing layers 41, 42 to be smaller than that of the well layer 36. In comparative example 2, a stabilizing process is performed for a duration of 36 seconds when the planarizing layers 41, 42 are formed. In comparative example 2, the wavelength of emitted light of 285 nm and the full width at half maximum of the emission spectrum of 14.6 nm were obtained when an electric current of 100 mA is conducted, but the light output did not reach 4 mW.

The results above show that the light emission characteristics of the semiconductor light-emitting element 10 are improved by inserting the planarizing layers 41, 42 in the active layer 26. In particular, the full width at half maximum of the emission spectrum of the semiconductor light-emitting element 10 is reduced by about 15%-30% to enhance the monochromaticity of the semiconductor light-emitting element 10 without impairing the emission intensity of the semiconductor light-emitting element 10. A stabilizing process of 12 seconds or 24 seconds further enhances the monochromaticity of the semiconductor light-emitting element 10, but a stabilizing process of 36 seconds lowers the light output of the semiconductor light-emitting element 10. It is therefore necessary that the duration of a stabilization process be shorter than 36 seconds, and, preferably, not shorter than 6 seconds and not longer than 30 seconds.

In the embodiment, the light emission characteristics of the semiconductor light-emitting element 10 are suitably improved by providing the two planarizing layers 41, 42 and inserting the barrier layer (second barrier layer 40b) between the two planarizing layers 41, 42. For improvement of the flatness of the well layer 36, it is considered preferable to increase the thickness of the planarizing layer underlying the well layer 36. If the thickness of the planarizing layer is increased, however, the ground level of the conduction band of the planarizing layer is lowered, which may result in light emission in the planarizing layer. If the AlN composition ratio of the planarizing layer is increased to prevent light emission in the planarizing layer, on the other hand, the difference in grating constant between the planarizing layer and the well layer 36 is increased and the improvement in flatness due to the insertion of the planarizing layer is hindered.

According to the embodiment, the ground level $E_1$ of the planarizing layers 41, 42 is configured to be higher than the ground level $E_0$ of the well layer 36 by inserting a plurality of planarizing layers 41, 42 each having a small thickness instead of inserting a planarizing layer having a large thickness. By securing a large total thickness of the plurality of planarizing layers 41, 42, the improvement in flatness due to the insertion of the planarizing layer is enhanced.

An attempt to increase the number of planarizing layers requires an increase in the number of barrier layers in accordance with the number of planarizing layers, which may result in a lower efficiency of injecting carriers into the well layer 36. It is therefore not preferred to increase the number of planarizing layers excessively. Our knowledge shows that the number of planarizing layers is preferably 4 or fewer, and, more preferably, about 1-3.

Described above is an explanation based on an exemplary embodiment. The embodiment is intended to be illustrative only and it will be understood by those skilled in the art that various design changes are possible and various modifications are possible and that such modifications are also within the scope of the present invention.

In the embodiment described above, the third barrier layer 40c is shown as being provided between the n-type clad layer 24 and the second planarizing layer 42. In a further variation, the third barrier layer 40c may not be provided, and the second planarizing layer 42 may be provided immediately above the n-type clad layer 24.

It should be understood that the invention is not limited to the above-described embodiment, but may be modified into various forms on the basis of the spirit of the invention. Additionally, the modifications are included in the scope of the invention.

What is claimed is:

1. A semiconductor light-emitting element comprising:
an n-type clad layer of an n-type AlGaN-based semiconductor material;
an active layer including:
a first barrier layer of an AlGaN-based semiconductor material provided on and in contact with the n-type clad layer;
a planarizing layer of an AlGaN-based semiconductor material provided on and in contact with the first barrier layer;
a second barrier layer of an AlGaN-based semiconductor material provided on and in contact with the planarizing layer; and
a well layer of an AlGaN-based semiconductor material provided on the second barrier layer
an electron blocking layer of an AlGaN-based semiconductor material provided on and in direct contact with the well layer; and
a p-type semiconductor layer provided on the electron blocking layer, wherein
the active layer emits deep ultraviolet light having a wavelength of 360 nm or shorter,
an AlN molar fraction of the n-type clad layer is 20% or higher,
an AlN molar fraction of the well layer is 10% or higher,
an AlN molar fraction of the planarizing layer is lower than an AlN molar fraction of each of the first barrier layer and the second barrier layer, and
a ground level of a conduction band of the planarizing layer is higher than a ground level of a conduction band of the well layer,
the ground level of the conduction band of the planarizing layer is lower than a ground level of a conduction band of the n-type clad layer,
a ground level of a conduction band of each of the first and second barrier layers is higher than the ground level of the conduction band of the n-type clad layer,
a ground level of a conduction band of the electron blocking layer is larger than the ground level of the conduction band of each of the first and second barrier layers, and
a difference in AlN molar fraction between the well layer and the planarizing layer is equal to or larger than 3% and equal to or smaller than 10%.

2. The semiconductor light-emitting element according to claim 1, wherein
a thickness of the planarizing layer in a direction of stack is smaller than a thickness of the well layer.

3. The semiconductor light-emitting element according to claim 1, wherein
the AlN molar fraction of the planarizing layer is higher than an AlN molar fraction of the well layer.

4. The semiconductor light-emitting element according to claim 1, wherein
a difference in the ground level of the conduction band between the planarizing layer and the well layer is equal to or larger than 2% of a light energy corresponding to a wavelength of light emitted from the active layer.

5. A semiconductor light-emitting element comprising:
an n-type clad layer of an n-type AlGaN-based semiconductor material;
an active layer including:
a first planarizing layer of an AlGaN-based semiconductor material provided on the n-type clad layer;
a first barrier layer of an AlGaN-based semiconductor material provided on and in contact with the first planarizing layer;
a second planarizing layer of an AlGaN-based semiconductor material provided on and in contact with the first barrier layer;
a second barrier layer of an AlGaN-based semiconductor material provided on and in contact with the second planarizing layer; and
a well layer of an AlGaN-based semiconductor material provided on the second barrier layer;
an electron blocking layer of an AlGaN-based semiconductor material provided on and in direct contact with the well layer; and
a p-type semiconductor layer provided on the electron blocking layer, wherein
the active layer emits deep ultraviolet light having a wavelength of 360 nm or shorter,
an AlN molar fraction of the n-type clad layer is 20% or higher,
an AlN molar fraction of the well layer is 10% or higher,
an AlN molar fraction of each of the first planarizing layer and the second planarizing layer is lower than an AlN molar fraction of each of the first barrier layer and the second barrier layer,
a ground level of a conduction band of each of the first planarizing layer and the second planarizing layer is higher than a ground level of a conduction band of the well layer,
the ground level of the conduction band of each of the first planarizing layer and the second planarizing layer is lower than a ground level of a conduction band of the n-type clad layer,
a ground level of a conduction band of each of the first and second barrier layers is higher than the ground level of the conduction band of the n-type clad layer,
a ground level of a conduction band of the electron blocking layer is larger than the ground level of the conduction band of each of the first and second barrier layers, and
a difference in AlN molar fraction between the well layer and each of the first planarizing layer and the second planarizing layer is equal to or larger than 3% and equal to or smaller than 10%.

6. The semiconductor light-emitting element according to claim 5, wherein
a thickness of each of the first planarizing layer and the second planarizing layer in the direction of stack is smaller than a thickness of the well layer.

7. The semiconductor light-emitting element according to claim 5, wherein
the AlN molar fraction of each of the first planarizing layer and the second planarizing layer is higher than an AlN molar fraction of the well layer.

8. The semiconductor light-emitting element according to claim 5, wherein
the active layer further includes a further barrier layer of an AlGaN-based semiconductor material provided between the n-type clad layer and the first planarizing layer.

* * * * *